US012684945B2

(12) United States Patent
Zhang et al.

(10) Patent No.: US 12,684,945 B2
(45) Date of Patent: Jul. 14, 2026

(54) DISPLAY PANEL AND MANUFACTURE METHOD THEREOF

(71) Applicant: WUHAN CHINA STAR OPTOELECTRONICS TECHNOLOGY CO., LTD., Wuhan (CN)

(72) Inventors: Yongdi Zhang, Wuhan (CN); Fei Al, Wuhan (CN); Dewei Song, Wuhan (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 444 days.

(21) Appl. No.: 18/558,236

(22) PCT Filed: Aug. 24, 2023

(86) PCT No.: PCT/CN2023/114659
§ 371 (c)(1),
(2) Date: Oct. 31, 2023

(87) PCT Pub. No.: WO2025/025284
PCT Pub. Date: Feb. 6, 2025

(65) Prior Publication Data
US 2025/0113633 A1 Apr. 3, 2025

(30) Foreign Application Priority Data
Jul. 31, 2023 (CN) .......................... 202310956417.4

(51) Int. Cl.
H10K 59/12 (2023.01)
H10F 55/155 (2025.01)
H10K 59/60 (2023.01)

(52) U.S. Cl.
CPC ........... *H10K 59/12* (2023.02); *H10F 55/155* (2025.01); *H10K 59/1201* (2023.02); *H10K 59/60* (2023.02)

(58) Field of Classification Search
CPC ........ H10F 55/155; H10K 59/12–1315; H10K 59/60
See application file for complete search history.

(56) References Cited

U.S. PATENT DOCUMENTS

2020/0321408 A1* 10/2020 Wang ..................... H10K 59/60
* cited by examiner

*Primary Examiner* — Daniel P Shook
(74) *Attorney, Agent, or Firm* — PV IP PC; Wei Te Chung

(57) ABSTRACT

A display panel and a manufacture method thereof are provided in embodiments of the present disclosure, and the display panel includes at least one photosensitive element each including a first electrode, a photosensitive semiconductor layer and a second electrode. The photosensitive semiconductor layer is disposed on the first electrode, and the second electrode is disposed on the photosensitive semiconductor layer. The photosensitive element further includes a connection insulation layer disposed between the second electrode and the photosensitive semiconductor layer. In the present application, leakage current in a dark state is lowered and an uniformity of different photosensitive elements is improved.

13 Claims, 5 Drawing Sheets

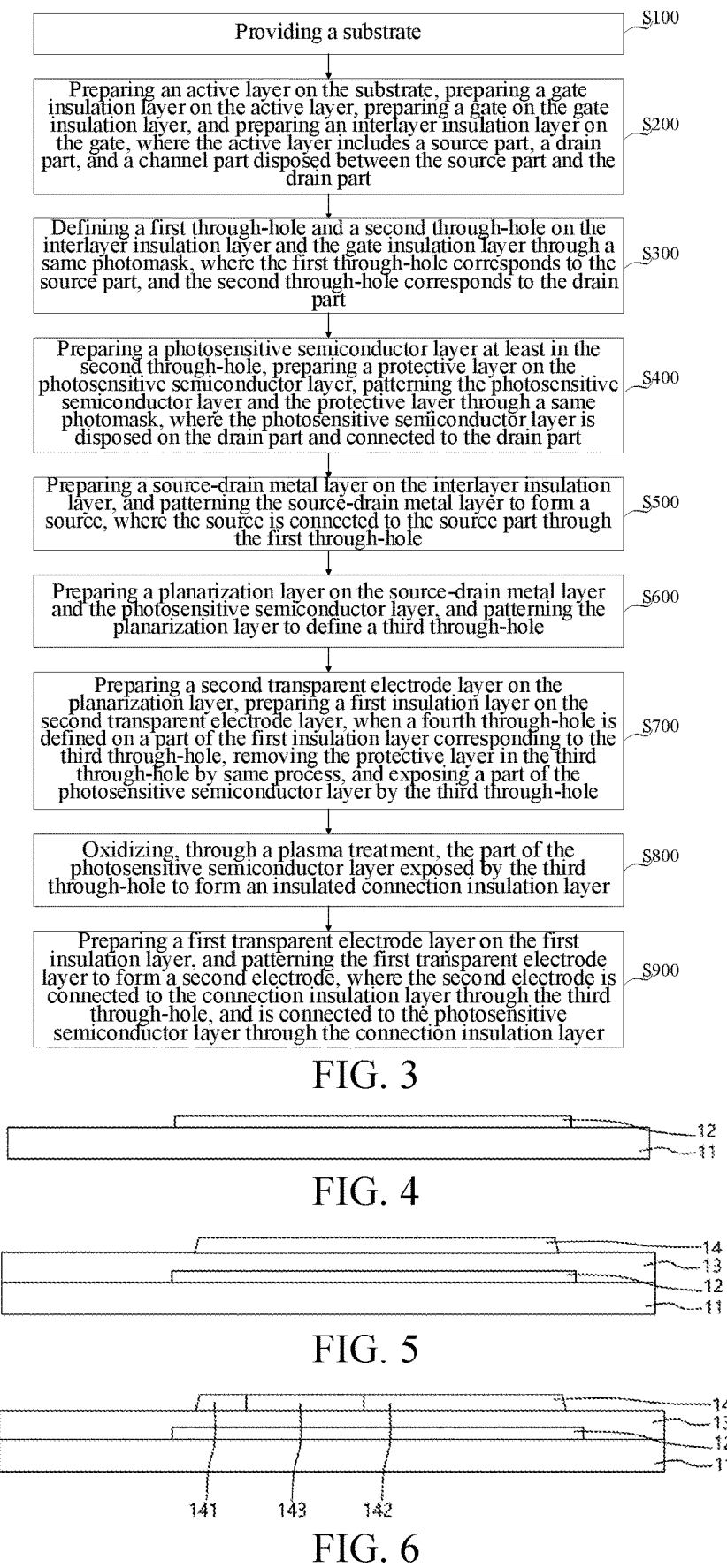

| |
|---|
| Providing a substrate — S100 |
| Preparing an active layer on the substrate, preparing a gate insulation layer on the active layer, preparing a gate on the gate insulation layer, and preparing an interlayer insulation layer on the gate, where the active layer includes a source part, a drain part, and a channel part disposed between the source part and the drain part — S200 |
| Defining a first through-hole and a second through-hole on the interlayer insulation layer and the gate insulation layer through a same photomask, where the first through-hole corresponds to the source part, and the second through-hole corresponds to the drain part — S300 |
| Preparing a photosensitive semiconductor layer at least in the second through-hole, preparing a protective layer on the photosensitive semiconductor layer, patterning the photosensitive semiconductor layer and the protective layer through a same photomask, where the photosensitive semiconductor layer is disposed on the drain part and connected to the drain part — S400 |
| Preparing a source-drain metal layer on the interlayer insulation layer, and patterning the source-drain metal layer to form a source, where the source is connected to the source part through the first through-hole — S500 |
| Preparing a planarization layer on the source-drain metal layer and the photosensitive semiconductor layer, and patterning the planarization layer to define a third through-hole — S600 |
| Preparing a second transparent electrode layer on the planarization layer, preparing a first insulation layer on the second transparent electrode layer, when a fourth through-hole is defined on a part of the first insulation layer corresponding to the third through-hole, removing the protective layer in the third through-hole by same process, and exposing a part of the photosensitive semiconductor layer by the third through-hole — S700 |
| Oxidizing, through a plasma treatment, the part of the photosensitive semiconductor layer exposed by the third through-hole to form an insulated connection insulation layer — S800 |
| Preparing a first transparent electrode layer on the first insulation layer, and patterning the first transparent electrode layer to form a second electrode, where the second electrode is connected to the connection insulation layer through the third through-hole, and is connected to the photosensitive semiconductor layer through the connection insulation layer — S900 |

DISPLAY PANEL AND MANUFACTURE METHOD THEREOF

CROSS REFERENCE TO RELATED APPLICATIONS

This application is a US national phase application based upon an International Application No. PCT/CN2023/114659, filed on Aug. 24, 2021, which claims priority to Chinese Patent Application No. 202310956417.4, filed on Jul. 31, 2023, and entitled "DISPLAY PANEL AND MANUFACTURE METHOD THEREOF", which are incorporated by reference herein in their entirety.

TECHNICAL FIELD

The present disclosure relates to the field of display technologies, and more particularly, to a display panel and a manufacture method thereof.

BACKGROUND

Display panels are widely used in lives of people, such as display screens of telephones and computers. With a rapidly development of display panel industries, in addition to requirements of high resolution, wide viewing angle and low power consumption for the display panels, people have also put forward other requirements for the display panels. Enriching panel functions, increasing human-machine interaction, and improving competitiveness of the display panels are currently one of main development directions of the display panels. Specifically, an ambient light detection function can automatically adjust screen brightness based on brightness of external environment, or automatically turn on a flash or light supplement when taking photos according to the external environment. Most existing ambient light detection elements (i.e., photosensitive elements) are externally mounted and thus production costs inevitably increase, although individual solutions for integrating the ambient light detection elements (i.e., photosensitive elements) in the display panels have been proposed.

However, an existing solution for integrating the photosensitive elements in the display panels has problems of high leakage current in a dark state and poor uniformity of the photosensitive elements.

SUMMARY

A display panel is provided in embodiments of the present disclosure, which can solve problems of high leakage current in the dark state and poor uniformity of photosensitive elements in an existing solution for integrating the photosensitive elements in the display panel.

A display panel is provided in the embodiments of the present disclosure, and the display panel includes
  a substrate;
  at least one control transistor and at least one photosensitive element; the at least one control transistor is disposed on the substrate and incudes an active layer, and the active layer includes a source part, a drain part and a channel part disposed between the source part and the drain part;
  the at least one photosensitive element and the at least one control transistor are disposed on a same side of the control transistor, each photosensitive element includes a first electrode, a photosensitive semiconductor layer and a second electrode, the first electrode is disposed on the substrate, the photosensitive semiconductor layer is disposed on the first electrode, and the second electrode is disposed on the photosensitive semiconductor layer; and the at least one control transistor is in control connection with the at least one photosensitive element; and each photosensitive element further includes a connection insulation layer disposed between the second electrode and the photosensitive semiconductor layer.

Optionally, in some embodiments of the present disclosure, the first electrode and the drain part are disposed on a same layer, and the first electrode is electrically connected to the drain part.

Optionally, in some embodiments of the present disclosure, a material of the first electrode is the same as a material of the drain part.

Optionally, in some embodiments of the present disclosure, a layer structure of the display panel includes:
  the substrate;
  the active layer, disposed on the substrate;
  a gate insulation layer, disposed on the active layer;
  a gate, disposed on the gate insulation layer and covering the channel part;
  an interlayer insulation layer, disposed on the gate;
  a first through-hole, penetrating the interlayer insulation layer and the gate insulation layer, and the first through-hole being disposed corresponding to the source part;
  a second through-hole, penetrating the interlayer insulation layer and the gate insulation layer, and the second through-hole being disposed corresponding to the first electrode;
  a source-drain metal layer, disposed on the interlayer insulation layer, the source-drain metal layer including a source, and the source being connected to the source part through the first through-hole;
  the photosensitive semiconductor layer, at least partially disposed in the second through-hole;
  the connection insulation layer, disposed on the photosensitive semiconductor layer;
  a planarization layer, disposed on the source-drain metal layer, the interlayer insulation layer and the photosensitive semiconductor layer, and a portion of the planarization layer which is corresponding to the connection insulation layer defining a third through-hole, and the third through-hole exposing at least part of the connection insulation layer; and
  a first transparent electrode layer, disposed on the planarization layer, and the first transparent electrode layer including the second electrode, the second electrode being connected to the connection insulation layer through the third through-hole, and being connected to the photosensitive semiconductor layer through the connection insulation layer.

Optionally, in some embodiments of the present disclosure, a side of the photosensitive semiconductor layer proximate to the second electrode is provided with a first sub part, and the first sub part is disposed around the connection insulation layer;
  a material of the connection insulation layer is obtained by oxidation of a material of the photosensitive semiconductor layer.

Optionally, in some embodiments of the present disclosure, a protective layer is disposed between the first sub part and the planarization layer, and an orthographic projection of the protective layer on the substrate overlaps with an orthographic projection of the first sub part on the substrate.

Optionally, in some embodiments of the present disclosure, an opening of a side of the third through-hole proximate to the photosensitive semiconductor layer coincides with an orthographic projection of the connection insulation layer on the substrate.

Optionally, in some embodiments of the present disclosure, the layer structure of the display panel further includes:

a first insulation layer disposed between the planarization layer and the first transparent electrode layer, in which the first insulation layer includes a fourth through-hole, and the second electrode is connected to the connection insulation layer through the fourth through-hole and the third through-hole; and a second transparent electrode layer disposed between the first insulation layer and the planarization layer.

Optionally, in some embodiments of the present disclosure, the layer structure of the display panel further includes:

a buffer layer disposed between the substrate and the active layer; and a light-shielding layer disposed between the buffer layer and the substrate, in which an orthographic projection of the light-shielding layer on the substrate covers an orthographic projection of the active layer on the substrate and an orthographic projection of the photosensitive semiconductor layer on the substrate.

Optionally, in some embodiments of the present disclosure, a thickness of the connection insulation layer is smaller than or equal to 500 angstroms (Å).

Optionally, in some embodiments of the present disclosure, the display panel includes a display area and multiple frame areas surrounding the display area, and the display panel includes multiple photosensitive elements, the multiple photosensitive elements are distributed in array in at least one of the multiple frame areas, and adjacent photosensitive elements are arranged at an interval.

Optionally, in some embodiments of the present disclosure, the display panel further includes a light blocking layer, and the light blocking layer includes multiple light blocking members, and the multiple photosensitive elements and the multiple light blocking members are arranged alternately in a plane of the display panel.

Correspondingly, the present disclosure further provides a manufacture method of the display panel, and the method includes:

providing a substrate;

preparing an active layer on the substrate, preparing a gate insulation layer on the active layer, preparing a gate on the gate insulation layer, and preparing an interlayer insulation on the gate, where the active layer includes a source part, a drain part, and a channel part disposed between the source part and the drain part;

defining a first through-hole and a second through-hole on the interlayer insulation layer and the gate insulation layer through a same photomask, where the first through-hole corresponds to the source part, and the second through-hole corresponds to the drain part;

preparing a photosensitive semiconductor layer at least in the second through-hole, preparing a protective layer on the photosensitive semiconductor layer, and patterning the photosensitive semiconductor layer and the protective layer through a same photomask, where the photosensitive semiconductor layer is disposed on the drain part and is connected to the drain part;

preparing a source-drain metal layer on the interlayer insulation layer, and patterning the source-drain metal layer to form a source connected to the source part through the first through-hole;

preparing a planarization layer on the source-drain metal layer and the photosensitive semiconductor layer, and patterning the planarization layer to define a third through-hole;

preparing a second transparent electrode layer on the planarization layer, preparing a first insulation layer on the second transparent electrode layer, when a fourth through-hole is defined on a part of the first insulation layer corresponding to the third through-hole, removing the protective layer inside the third through-hole by a same process, and exposing a part of the photosensitive semiconductor layer by the third through-hole;

oxidating, through a plasma treatment, the part of the photosensitive semiconductor layer exposed by the third through-hole to form an insulated connection insulation layer; and preparing a first transparent electrode layer on the first insulation layer, and patterning the first transparent electrode layer to form a second electrode, where the second electrode is connected to the connection insulation layer through the third through-hole, and is connected to the photosensitive semiconductor layer through the connection insulation layer.

Beneficial Effect

A display panel and a manufacture method of the display panel are provided in embodiments of the present disclosure, the display panel includes a substrate, at least one control transistor and at least one photosensitive element; the at least one control transistor is disposed on the substrate, the control transistor includes an active layer, and the active layer includes a source part, a drain part and a channel disposed between the source part and the drain part; the photosensitive element and the control transistor are disposed on a same side of the substrate, the photosensitive element includes a first electrode, a photosensitive semiconductor layer and a second electrode, the first electrode is disposed on the substrate, the photosensitive semiconductor layer is disposed on the first electrode, and the second electrode is disposed on the photosensitive semiconductor layer; the control transistor is in control connection to the photosensitive semiconductor layer; and the photosensitive element further includes a connection insulation layer disposed between the second electrode and the photosensitive semiconductor layer. Compared to an existing solution for external photosensitive element, a solution for integrating the photosensitive element in the display panel provided in the embodiments of the present disclosure has effects of high integration and low costs. Meanwhile, a structure of the photosensitive element is combined with a structure and a process of a thin film transistor (TFT) of the existing display panel to improve an integration and combination degree of the process, and to reduce process steps and a number of photomasks. Moreover, the photosensitive element further includes the connection insulation layer disposed between the second electrode and the photosensitive semiconductor layer, and the connection insulation layer can share a part of electric field in the photosensitive element. When the first electrode and the second electrode are applied a same voltage, intensity of the electric field acting on the photosensitive semiconductor layer is reduced, so as to reduce leakage current, reduce sensitivity of leakage current in a dark state, avoid significant differences in an upturn degree of leakage current in a dark state between different photosensitive elements, lower the leakage current in a dark state, and improve an uniformity between different photosensitive elements.

BRIEF DESCRIPTION OF THE DRAWINGS

In order to illustrate the technical solutions in the embodiments of the present disclosure clearly, the accompanying drawings involved in the description of the embodiments are described briefly below. It will be apparent that the accompanying drawings in the following description are merely some of the embodiments of the present disclosure, and based on these drawings, other drawings may be made to those skilled in the art without involving any inventive effort.

FIG. 3 is a flowchart of a manufacture method of a display panel provided in an embodiment 3 of the present disclosure.

FIG. 4 is a schematic diagram of a first intermediate process of the manufacture method of the display panel provided in the embodiment 3 of the present disclosure.

FIG. 5 is a schematic diagram of a second intermediate process of the manufacture method of the display panel provided in the embodiment 3 of the present disclosure.

FIG. 6 is a schematic diagram of a third intermediate process of the manufacture method of the display panel provided in the embodiment 3 of the present disclosure.

DETAILED DESCRIPTION OF THE EMBODIMENTS

Technical solutions of embodiments of the present disclosure will be described below clearly and fully, in connection with accompanying drawings. Obviously, the described embodiments are merely some of the embodiments of the present disclosure, not all of them. Based on the embodiments of the present disclosure, all other embodiments obtained by those skilled in the art without involving any inventive effort fall within a scope of protective of the present disclosure. Moreover, it should be understood that the specific embodiments described here are only used to describe and explain the present disclosure, and are not used to limit the present disclosure. In the present disclosure, without any explanation to the contrary, directional terms used herein such as "upper" and "lower" usually refer to the upper and lower positions of a device in an actual use or working state, specifically the direction of the figures of the accompanying drawings, and terms "inner" and "outer" refer to a profile of the device.

The present disclosure provides a display panel, and the display panel includes a substrate, at least one control transistor and at least one photosensitive element. The at least one control transistor is disposed on the substrate. The control transistor includes an active layer, and the active layer includes a source part, a drain part and a channel part disposed between the source part and the drain part. The at least one photosensitive element and the at least one control transistor are disposed on a same side of the substrate. The photosensitive element includes a first electrode, a photosensitive semiconductor layer and a second electrode. The first electrode is disposed on the substrate. The photosensitive semiconductor layer is disposed on the first electrode. The second electrode is disposed on the photosensitive semiconductor layer. The control transistor is in control connection with the photosensitive element. And, the photosensitive element further includes a connection insulation layer disposed between the second electrode and the photosensitive semiconductor layer.

The present disclosure further provides a manufacture method of the above display panel. Hereinafter, the above contents are described in detail respectively. It should be noted that description order of the following embodiments is not taken as a limitation to a preferred order of the embodiments.

Embodiment 1

Figure 1:
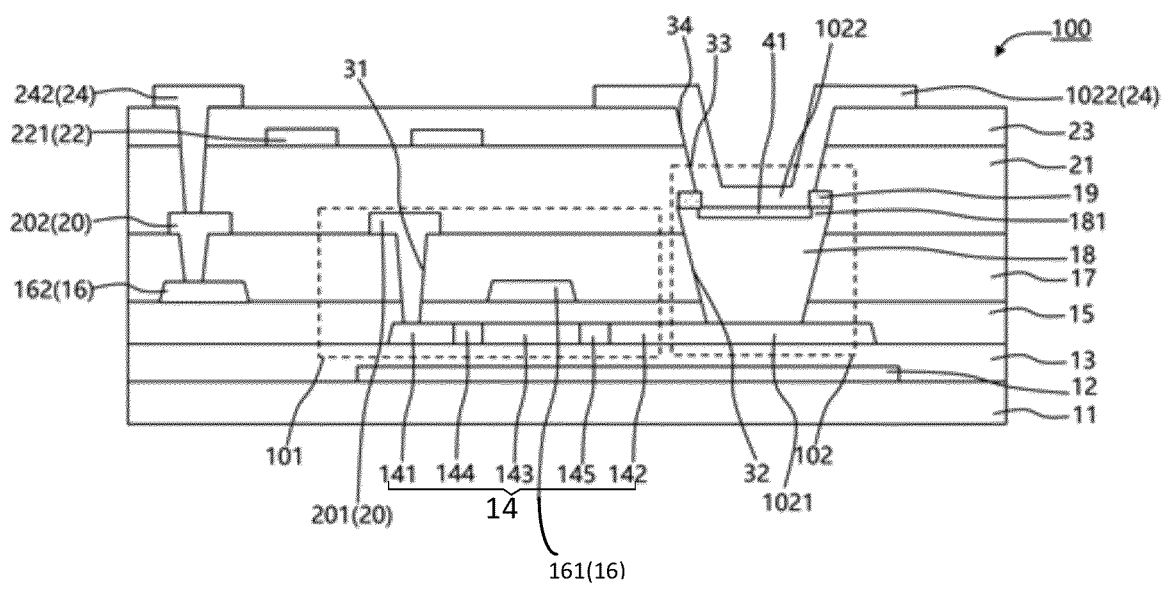
FIG. 1 is a schematic sectional diagram of a display panel provided in an embodiment 1 of the present disclosure.

As shown in FIG. 1, FIG. 1 is a schematic sectional diagram of a display panel provided in the embodiment 1 of the present disclosure.

The present disclosure provides a display panel 100, and the display panel 100 includes a substrate 11, at least one control transistor 101 and at least one photosensitive element 102. The at least one control transistor 101 is disposed on the substrate 11. The control transistor 101 includes an active layer 14. The active layer 14 incudes a source part 141, a drain part 142 and a channel part 143 disposed between the source part 141 and the drain part 142. The photosensitive element 102 and the control transistor 101 are disposed on a same side of the substrate 11. The photosensitive element 102 includes a first electrode 1021, a photosensitive semiconductor layer 18 and a second electrode 1022. The first electrode 1021 is disposed on the substrate 11, the photosensitive semiconductor layer 18 is disposed on the first electrode 1021, and the second electrode 1022 is disposed on the photosensitive semiconductor layer 18. The control transistor 101 is in control connection with the photosensitive element 102. Specifically, the photosensitive element 102 further includes a connection insulation layer 41 disposed between the second electrode 1022 and the photosensitive semiconductor layer 18.

Specifically, the substrate 11 can be a glass substrate or a flexible substrate, and there is not limitation here.

Specifically, the control transistor 101 is in control connection with the photosensitive element 102, and the control transistor 101 can control states of the photosensitive element 102 such as a turning-on state and a turning-off state.

Specifically, the active layer 14 includes the source part 141 and the drain part 142, and the source part 141 and the drain part 142 can be heavily doped areas.

Specifically, the active layer 14 includes the source part 141 and the drain part 142. It is easy to understand that the source part 141 and the drain part 142 are opposite. For example, it can be understood that, in one implementation, the source part 141 is actually a drain part, and the drain part 142 is actually a source part.

Specifically, the active layer 14 further includes a first lightly doped part 144 disposed between the source part 141 and the channel part 143, and a second lightly doped part 145 disposed between the drain part 142 and the channel part 143.

Specifically, the first electrode 1021 is disposed on the substrate 11. The photosensitive semiconductor layer 18 is disposed on the first electrode 1021. The second electrode 1022 is disposed on the photosensitive semiconductor layer 18. External light irradiates onto the photosensitive semiconductor layer 18, and light current is generated between the first electrode 1021 and the second electrode 1022.

Compared to an existing solution for external photosensitive element, a solution for integrating the photosensitive element 102 in the display panel provided in the embodiment has effects of high integration and low costs. Meanwhile, a structure of the photosensitive element 102 is combined with a structure and a process of a thin film transistor of an existing display panel to improve an integration and combination degree of the process, and to reduce process steps and a number of photomasks. Moreover, the photosensitive element 102 further includes the connection insulation layer 41 disposed between the second electrode 1022 and the photosensitive semiconductor layer 18. The connection insulation layer 41 can share a part of electric field in the photosensitive element 102. When the first electrode 1021 and the second electrode 1022 are applied a same voltage, intensity of the electric field acting on the photosensitive semiconductor layer 18 is reduced, so as to reduce leakage current, reduce sensitivity of leakage current in a dark state, avoid significant differences in an upturn degree of leakage current in a dark state between different photosensitive elements 102, reduce the leakage current in a dark state, and improve an uniformity between different photosensitive elements 102.

In some embodiments, the first electrode 1021 and the drain part 142 are disposed on a same layer, and the first electrode 1021 is electrically connected to the drain part 142.

Specifically, as shown in FIG. 1, the first electrode 1021 and the drain part 142 are disposed on the same layer, and the first electrode 1021 is electrically connected to the drain part 142, which can improve an integration of the photosensitive element 102.

In some embodiments, a material of the first electrode 1021 is the same as a material of the drain part 142.

Specifically, the first electrode 1021 and the drain part 142 are disposed on the same layer, and the material of the first electrode 1021 is the same as the material of the drain part 142. In this way, the first electrode 1021 and the drain part 142 can be manufactured by a same process at the same time, which can combine the structure of the photosensitive element 102 with the structure and the process of the thin film transistor of the existing display panel to improve the integration and combination degree of the process, and to reduce the process steps and the number of photomasks.

In some embodiments, a layer structure of the display panel 100 includes: the substrate 11, the active layer 14, a gate insulation layer 15, a gate 161, an interlayer insulation layer 17, a first through-hole 31, a second through-hole 32, a source-drain metal layer 20, the photosensitive semiconductor layer 18, the connection insulation layer 41, a planarization layer 21, and a first transparent electrode layer 24. The active layer 14 is disposed on the substrate 11. The gate insulation layer 15 is disposed on the active layer 14. The gate 161 is disposed on the gate insulation layer 15 and covers the channel part 143. The interlayer insulation layer 17 is disposed on the gate 161. The first through-hole 31 penetrates the interlayer insulation layer 17 and the gate insulation layer 15, and the first through-hole 31 is disposed corresponding to the source part 141. The second through-hole 32 penetrates the interlayer insulation layer 17 and the gate insulation layer 15, and the second through-hole 32 is disposed corresponding to the first electrode 1021. The source-drain metal layer 20 is disposed on the interlayer insulation layer 17. The source-drain metal layer 20 includes a source 201, and the source 201 is connected to the source part 141 through the first through-hole 31. The photosensitive semiconductor layer 18 is at least partially disposed in the second through-hole 32. The connection insulation layer 41 is disposed on the photosensitive semiconductor layer 18. The planarization layer 21 is disposed on the source-drain metal layer 20, the interlayer insulation layer 17 and the photosensitive semiconductor layer 18. A portion of the planarization layer 21 corresponding to the connection insulation layer 41 defines a third through-hole 33, and the third through-hole 33 exposes at least part of the connection insulation layer 41. The first transparent electrode layer 24 is disposed on the planarization layer 21. The first transparent electrode layer 24 includes the second electrode 1022. The second electrode 1022 is connected to the connection insulation layer 41 through the third through-hole 33, and is connected to the photosensitive semiconductor layer 18 through the connection insulation layer 41.

Specifically, FIG. 1 illustrates a layer structure of the display panel 100 in an area of the control transistor 101. The layer structure includes the following sequentially stacked layers: the substrate 11, a light-shielding layer 12 disposed on the substrate 11, a buffer layer 13 disposed on the light-shielding layer 12, the active layer 14 disposed on the buffer layer 13, the gate insulation layer 15 disposed on the active layer 14, a gate metal layer 16 disposed on the gate insulation layer 15, the interlayer insulation layer 17 disposed on the gate metal layer 16, the source-drain metal layer 20 disposed on the interlayer insulation layer 17, the planarization layer 21 disposed on the interlayer insulation layer 17 and the source-drain metal layer 20, a second transparent electrode layer 22 disposed on the planarization layer 21, a first insulation layer 23 disposed on the second transparent electrode layer 22, and the first transparent electrode layer 24 disposed on the first insulation layer 23. Specifically, the active layer 14 includes the source part 141 (i.e., first heavily doped part), the first lightly doped part 144, the channel part 143, the second lightly doped part 145, and the drain part 142 (i.e., second heavily doped part). The gate metal layer 16 includes the gate 161 and a first connection electrode 162. The source-drain metal layer 20 includes the source 201 and a second connection electrode 202. One of the first transparent electrode layer 24 and the second transparent electrode layer 22 includes a common electrode, and another one of the first transparent electrode layer 24 and the second transparent electrode layer 22 includes a pixel electrode. FIG. 1 illustrates that the second transparent electrode layer 22 includes a common electrode 221, and the first transparent electrode layer 24 includes a pixel electrode 242 and the second electrode 1022.

Specifically, FIG. 1 illustrates a layer structure of the display panel 100 in an area of the photosensitive element 102, and the layer structure includes the following sequentially stacked layers: the substrate 11, the light-shielding layer 12 disposed on the substrate 11, the buffer layer 13 disposed on the light-shielding layer 12, the active layer 14 disposed on the buffer layer 13, the photosensitive semiconductor layer 18 disposed on the first electrode 1021 or the drain part 142 of the active layer 14, the connection insulation layer 41 disposed on the photosensitive semiconductor layer 18, a protective layer 19 disposed on a first sub part 181 of the photosensitive semiconductor layer 18, and the second electrode 1022 disposed on the connection insulation layer 41 and the protective layer 19.

Specifically, the third through-hole 33 exposes the at least part of the connection insulation layer 41, the second electrode 1022 is connected to the at least part of the connection insulation layer 41 exposed by the third through-hole 33 through the third through-hole 33, and the second electrode 1022 is connected to the photosensitive semiconductor layer 18 through the connection insulation layer 41.

In some embodiments, a side of the photosensitive semiconductor layer 18 which is proximate to the second electrode 1022 is provided with the first sub part 181, and the first sub part 181 is disposed around the connection insulation layer 41. A material of the connection insulation layer 41 is obtained by oxidation of a material of the photosensitive semiconductor layer 18.

Specifically, in a plane direction of the display panel 100, the photosensitive semiconductor layer 18 includes the first sub part 181, and the connection insulation layer 41 is surrounded by the first sub part 181.

Specifically, a plane of the display panel 100 refers to a plane perpendicular to a thickness direction of the display panel.

Specifically, the material of the connection insulation layer 41 is obtained by oxidation of the material of the photosensitive semiconductor layer 18, which can reduce manufacturing process steps and a number of photomasks of the connection insulation layer 41.

Specifically, the connection insulation layer 41 can be obtained by performing a plasma treatment on the photosensitive semiconductor layer 18, which can reduce the manufacturing process steps and the number of photomasks of the connection insulation layer 41. A part around the connection insulation layer 41 that has not been oxidized by the plasma treatment is the first sub part 181, and the first sub part 181 surrounds the connection insulation layer 41.

Further, as described in the following embodiments, the connection insulation layer 41 can be obtained by performing the plasma treatment on the photosensitive semiconductor layer 18, which can reduce the manufacturing process steps and the number of photomasks of the connection insulation layer 41. Therefore, the material of the connection insulation layer 41 includes silicon oxide (SiOx).

In some embodiments, the protective layer 19 is disposed between the first sub part 181 and the planarization layer 21, and an orthographic projection of the protective layer 19 on the substrate 11 overlaps with an orthographic projection of the first sub part 181 on substrate 11.

Specifically, the display panel further includes the protective layer 19. The protective layer 19 is disposed between the first sub part 181 and the second electrode 1022, and is disposed to be contact with the first sub part 181. And, the orthographic projection of the protective layer 19 on the substrate 11 overlaps with the orthographic projection of the first sub part 181 on substrate 11.

Specifically, as described in the following embodiments, the protective layer 19 is used to protect the photosensitive semiconductor layer 18 during a manufacturing process of the display panel, and avoid etching or damaging the photosensitive semiconductor layer 18 in some process steps.

Specifically, as described in the following embodiments, the protective layer 19 and the photosensitive semiconductor layer 18 are patterned through a same process, which can simplify the manufacturing process steps and the number of the photomasks. Moreover, a part of the photosensitive semiconductor layer 18 exposed by the third through-hole 33 is oxidated through the plasma treatment, and the third through-hole 33 penetrates the protective layer 19. Therefore, the orthographic projection of the protective layer 19 on the substrate 11 overlaps with the orthographic projection of the first sub part 181 on substrate 11.

In some embodiments, an opening of a side of the third through-hole 33 which is proximate to the photosensitive semiconductor layer 18 coincides with an orthographic projection of the connection insulation layer 41 on the substrate 11.

Specifically, the photosensitive semiconductor layer 18 exposed by the third through-hole 33 is oxidated through the plasma treatment to form the connection insulation layer 41. Therefore, the opening of the side of the third through-hole 33 which is proximate to the photosensitive semiconductor layer 18 coincides with the orthographic projection of the connection insulation layer 41 on the substrate 11.

In some embodiments, the layer structure of the display panel 100 further includes the first insulation layer 23 and the second transparent electrode layer 22. The first insulation layer 23 is disposed between the planarization layer 21 and the first transparent electrode layer 24. The first insulation layer 23 includes a fourth through-hole 34, and the second electrode 1022 is connected to the connection insulation layer 41 through the fourth through-hole 34 and the third through-hole 33. The second transparent electrode layer 22 is disposed between the first insulation layer 23 and the planarization layer 21.

Specifically, one of the first transparent electrode layer 24 and the second transparent electrode layer 22 includes the common electrode, and another one of the first transparent electrode layer 24 and the second transparent electrode layer 22 includes the pixel electrode. FIG. 1 illustrates that the second transparent electrode layer 22 includes the common electrode 221, and the first transparent electrode layer 24 includes the pixel electrode 242 and the second electrode 1022.

In some embodiments, the layer structure of the display panel 100 further includes the buffer layer 13 and the light-shielding layer 12. The buffer layer 13 is disposed between the substrate 11 and the active layer 14. The light-shielding layer 12 is disposed between the buffer layer 13 and the substrate 11. Specifically, an orthographic projection of the light-shielding layer 12 on the substrate 11 covers an orthographic projection of the active layer 14 on substrate 11 and an orthographic projection of the photosensitive semiconductor layer 18 on the substrate 11.

Specifically, the orthographic projection of the light-shielding layer 12 on the substrate 11 covers the orthographic projection of the active layer 14 on substrate 11 and the orthographic projection of the photosensitive semiconductor layer 18 on the substrate 11, which can prevent light of a backlight or the like from irradiating the active layer 14 and the photosensitive semiconductor layer 18, avoid a generation of photoelectric carriers or charges caused by nonambient light, and improve accuracy and precision of the photosensitive element 102.

In some embodiments, a thickness of the connection insulation layer 41 is smaller than or equal to 500 angstroms (Å).

Specifically, the thickness of the connection insulation layer 41 should not be too large, so as to avoid an effect of the connection insulation layer 41 on a turning-on state current of the photosensitive element 102. Specifically, the thickness of the connection insulation layer 41 is smaller than or equal to 500 Å. In an actual production, preferably, the thickness of the connection insulation layer 41 is smaller than or equal to 200 Å, which can better reduce the leakage current in a dark state, and avoid the effect of the connection insulation layer 41 on the turning-on state current of the photosensitive element 102.

In the above embodiments, the photoelectric carriers or the charges can flow among the source 201, the source part 141, the channel part 143, the drain part 142, the photosensitive semiconductor layer 18 and the second electrode 1022, sequentially.

In the above embodiments, a material of the active layer 14 includes anyone of polycrystalline silicon, amorphous silicon and oxide semiconductors, and the material of the photosensitive semiconductor layer 18 can include the amorphous silicon.

In the above embodiments, the material of the active layer 14 includes anyone of the polycrystalline silicon, the amorphous silicon and the oxide semiconductors. Therefore, a switching transistor can be anyone of a polycrystalline silicon thin film transistor, an amorphous silicon thin film transistor, and an oxide semiconductor thin film transistor.

In the above embodiments, the photosensitive semiconductor layer 18 is used for a photosensitive purpose, and generates the photoelectric carriers or the charges under light irradiation. Specifically, the material of the photosensitive semiconductor layer 18 includes the amorphous silicon, which can better generate the photoelectric carriers or the charges under the light irradiation.

Embodiment 2

The display panel 100 of the present embodiment is the same as or similar to anyone of the display panels 100 in the above embodiment 1. The embodiment further describes a location distribution of the photosensitive element in the display panel 100, and the same or the similar between the present embodiment and the above embodiment is not repeated here.

Figure 2:
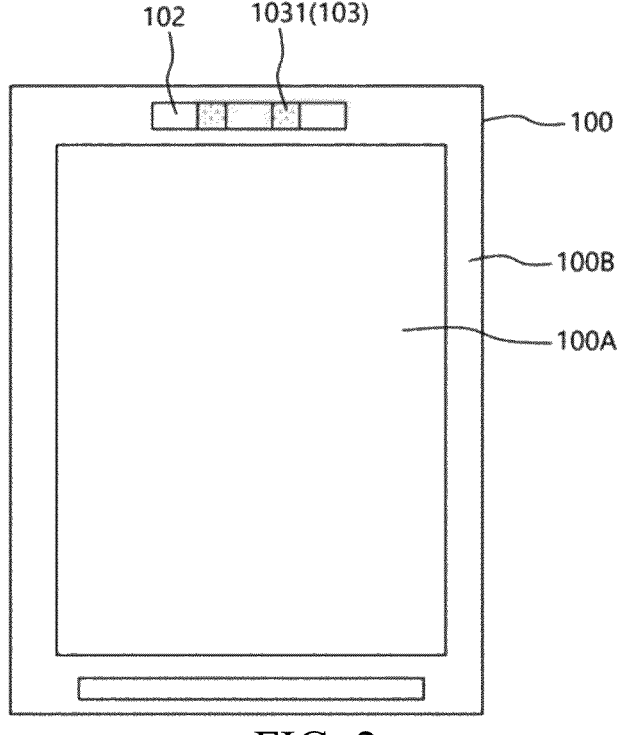
FIG. 2 is a schematic diagram of a distribution of a photosensitive element in a display panel provided in an embodiment 2 of the present disclosure.

As shown in FIG. 2, and FIG. 2 is a schematic diagram of a distribution of the photosensitive element in the display panel 100 provided in the embodiment 2 of the present disclosure.

In some embodiments, the display panel 100 includes a display area 100A and multiple frame areas 100B surrounding the display area 100A. The display panel 100 includes multiple photosensitive elements 102. The photosensitive elements 102 are distributed in array in at least one of the frame areas 100B, and adjacent photosensitive elements 102 are arranged at an interval.

Specifically, the photosensitive elements 102 are distributed in array in at least one of the frame areas 100B, which makes the photosensitive elements 102 not occupy the display area, and avoids a decrease in an aperture rate of the pixel of the display area 100A.

Specifically, the adjacent photosensitive elements 102 are arranged at an interval, which avoids a mutual interference between the adjacent photosensitive elements 102.

In some embodiments, the display panel 100 further includes a light blocking layer 103. The light blocking layer 103 includes multiple light blocking members 1031, and the photosensitive elements 102 and the light blocking members 1031 are arranged alternately in the plane of the display panel 100.

Specifically, the photosensitive elements 102 and the light blocking members 1031 are arranged alternately, which can better avoid the mutual interference between the adjacent photosensitive elements 102.

Specifically, the display panel 100 can include an array substrate and a color film substrate. The photosensitive elements 102 can be disposed on the array substrate, and the light blocking layer 103 can be disposed on the color film substrate. The light blocking layer 103 can be a black matrix (BM).

Embodiment 3

The embodiment provides a manufacture method of the display panel, and anyone of the display panels in the above embodiments can be prepared by using the manufacture method of the display panel in the embodiment.

Figures 7, 8, 9, 10:
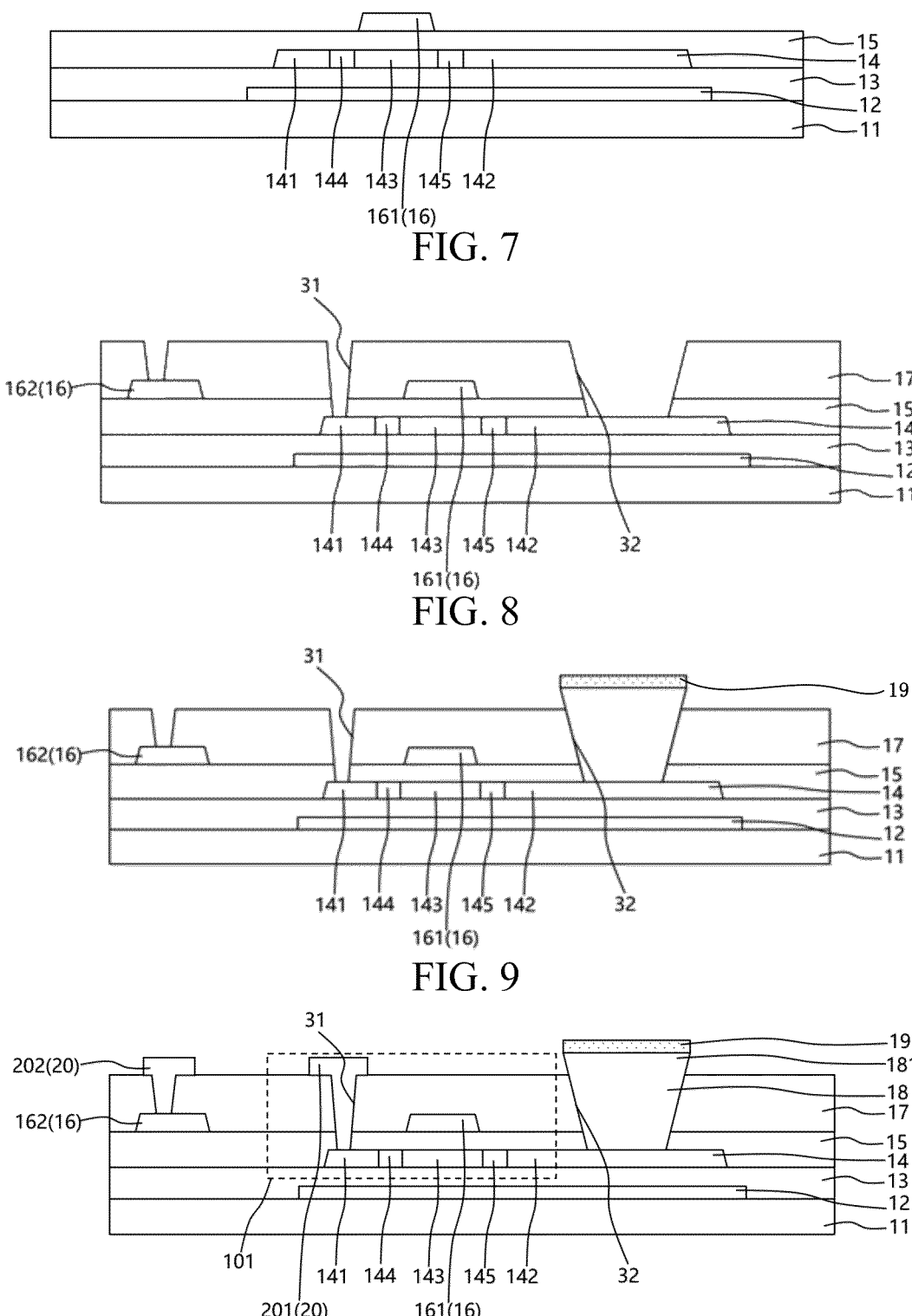
FIG. 7 is a schematic diagram of a fourth intermediate process of the manufacture method of the display panel provided in the embodiment 3 of the present disclosure.
FIG. 8 is a schematic diagram of a fifth intermediate process of the manufacture method of the display panel provided in the embodiment 3 of the present disclosure.
FIG. 9 is a schematic diagram of a sixth intermediate process of the manufacture method of the display panel provided in the embodiment 3 of the present disclosure.
FIG. 10 is a schematic diagram of a seventh intermediate process of the manufacture method of the display panel provided in the embodiment 3 of the present disclosure.
Figure 11:
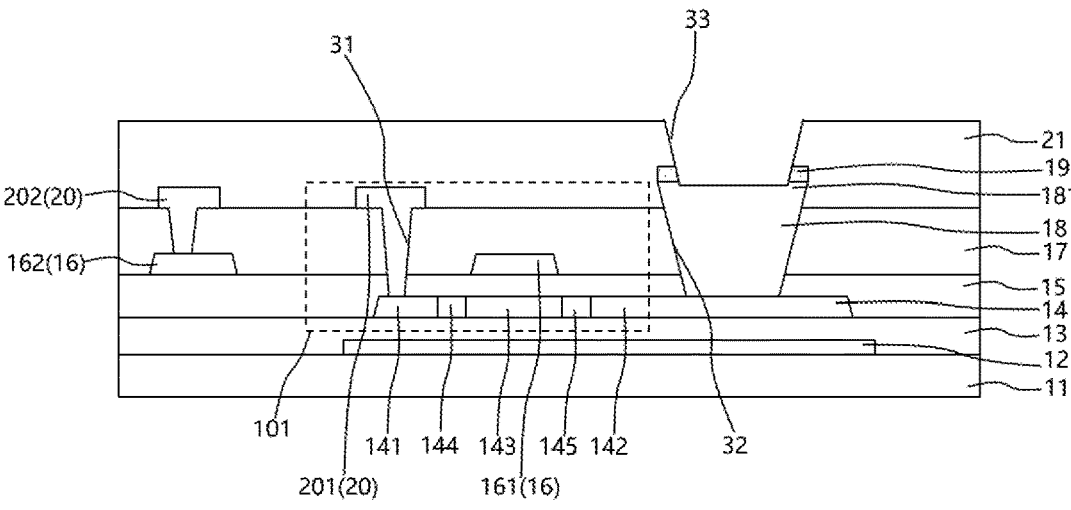
FIG. 11 is a schematic diagram of an eighth intermediate process of the manufacture method of the display panel provided in the embodiment 3 of the present disclosure.
Figure 12:
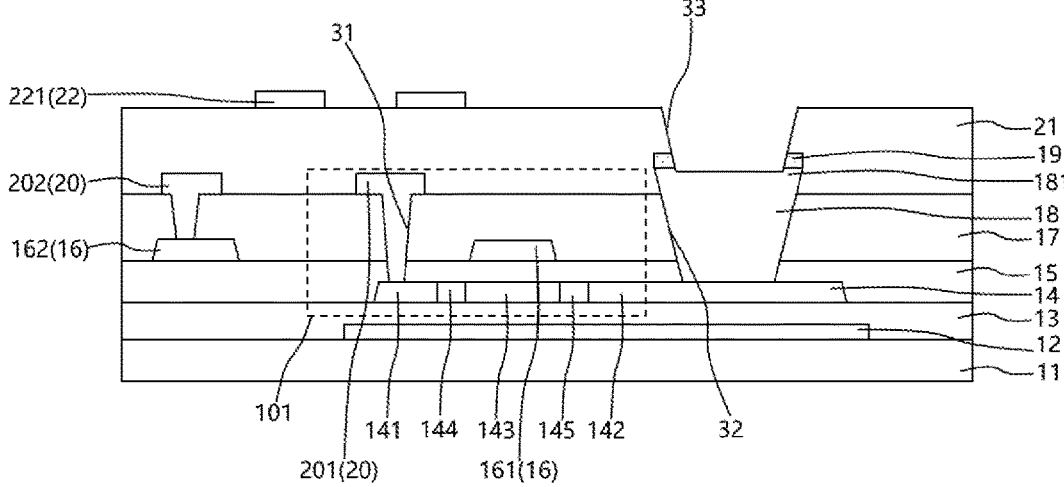
FIG. 12 is a schematic diagram of a ninth intermediate process of the manufacture method of the display panel provided in the embodiment 3 of the present disclosure.
Figure 13:
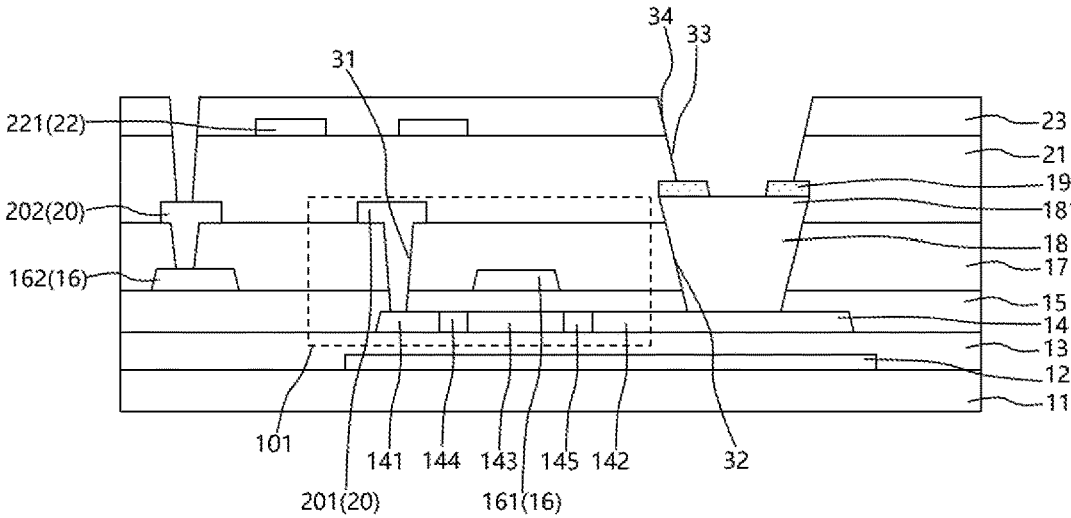
FIG. 13 is a schematic diagram of a tenth intermediate process of the manufacture method of the display panel provided in the embodiment 3 of the present disclosure.
Figure 14:
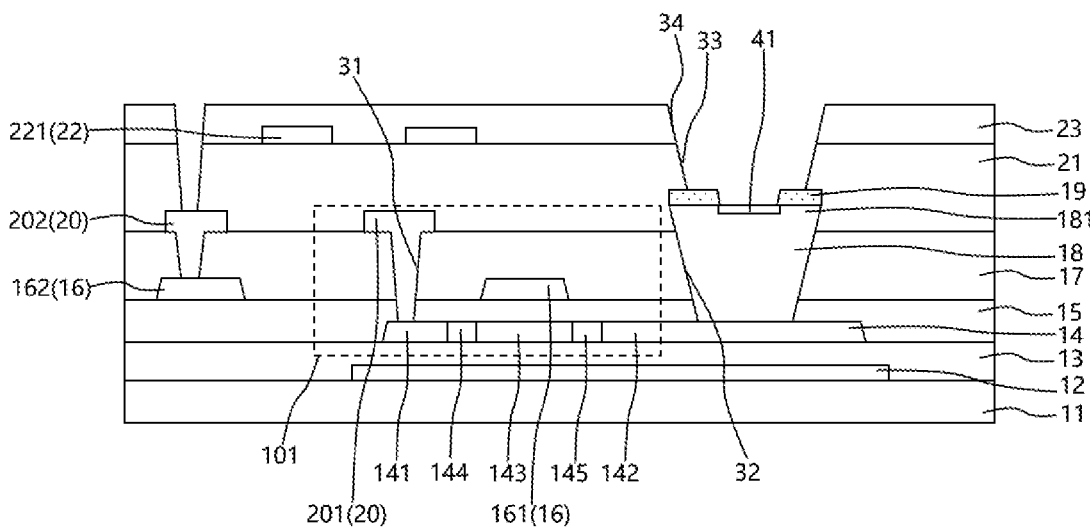
FIG. 14 is a schematic diagram of an eleventh intermediate process of the manufacture method of the display panel provided in the embodiment 3 of the present disclosure.

As shown in FIGS. 3-14, FIG. 3 is a flowchart of the manufacture method of the display panel provided in the embodiment 3 of the present disclosure; FIG. 4 is a schematic diagram of a first intermediate process of the manufacture method of the display panel provided in the embodiment 3 of the present disclosure; FIG. 5 is a schematic diagram of a second intermediate process of the manufacture method of the display panel provided in the embodiment 3 of the present disclosure; FIG. 6 is a schematic diagram of a third intermediate process of the manufacture method of the display panel provided in the embodiment 3 of the present disclosure; FIG. 7 is a schematic diagram of a fourth intermediate process of the manufacture method of the display panel provided in the embodiment 3 of the present disclosure; FIG. 8 is a schematic diagram of a fifth intermediate process of the manufacture method of the display panel provided in the embodiment 3 of the present disclosure; FIG. 9 is a schematic diagram of a sixth intermediate process of the manufacture method of the display panel provided in the embodiment 3 of the present disclosure; FIG. 10 is a schematic diagram of a seventh intermediate process of the manufacture method of the display panel provided in the embodiment 3 of the present disclosure; FIG. 11 is a schematic diagram of an eighth intermediate process of the manufacture method of the display panel provided in the embodiment 3 of the present disclosure; FIG. 12 is a schematic diagram of a ninth intermediate process of the manufacture method of the display panel provided in the embodiment 3 of the present disclosure; FIG. 13 is a schematic diagram of a tenth intermediate process of the manufacture method of the display panel provided in the embodiment 3 of the present disclosure; and FIG. 14 is a schematic diagram of an eleventh intermediate process of the manufacture method of the display panel provided in the embodiment 3 of the present disclosure.

The embodiment provides the manufacture method of the display panel, and the method includes the following steps: S100, S200, S300, S400, S500, S600, S700, S800, and S900. Numbers of the process steps are not as a limitation of a manufacturing order here.

In step S100, a substrate is provided.

Specifically, as shown in FIG. 4, a substrate 11 is provided.

In step S200, an active layer is prepared on the substrate, and a gate insulation layer is prepared on the active layer, a gate is prepared on the gate insulation layer, and an interlayer insulation layer is prepared on the gate, in which the active layer includes a source part, a drain part and a channel part disposed between the source part and the drain part.

Specifically, as shown in FIGS. 5-8, an active layer 14 is prepared on the substrate 11, and a gate insulation layer 15 is prepared on the active layer 14, a gate 161 is prepared on the gate insulation layer 15, and an interlayer insulation layer 17 is prepared on the gate 161. The active layer 14 includes a source part 141, a drain part 142 and a channel part 143 disposed between the source part 141 and the drain part 142.

Specifically, before preparing the active layer 14 on the substrate 11, a light-shielding layer 12 can be also prepared on the substrate 11, a buffer layer 13 can be also prepared on the light-shielding layer 12, and the active layer 14 can be prepared on the buffer layer 13.

In step S300, a first through-hole and a second through-hole are defined on the interlayer insulation layer and the gate insulation layer through a same photomask, in which the first through-hole is disposed corresponding to the source part, and the second through-hole is disposed corresponding to the drain part.

Specifically, as shown in FIG. 8, a first through-hole 31 and a second through-hole 32 are defined on the interlayer insulation layer 17 and the gate insulation layer 15 through a same photomask, the first through-hole 31 is disposed corresponding to the source part 141, and the second through-hole 32 is disposed corresponding to the drain part 142.

Specifically, the first through-hole 31 and the second through-hole 32 are defined on the interlayer insulation layer 17 and the gate insulation layer 15 through the same photomask, which can simplify manufacturing process steps of the display panel and reduce a number of the photomasks.

In step S400, a photosensitive semiconductor layer is at least prepared in the second through-hole, a protective layer is prepared on the photosensitive semiconductor layer, the photosensitive semiconductor layer and the protective layer are patterned through a same photomask, and the photosensitive semiconductor layer is disposed on the drain part and is connected to the drain part.

Specifically, as shown in FIG. 9, a photosensitive semiconductor layer 18 is at least prepared in the second through-hole 32, a protective layer 19 is prepared on the photosensitive semiconductor layer 18, the photosensitive semiconductor layer 18 and the protective layer 19 are patterned through a same photomask, and the photosensitive semiconductor layer 18 is disposed on the drain part 142 and is connected to the drain part 142.

Specifically, the photosensitive semiconductor layer 18 and the protective layer 19 are patterned through the same photomask, which can simplify the manufacturing process steps of the display panel and reduce the number of the photomasks.

In step S500, a source-drain metal layer is prepared on the interlayer insulation layer, the source-drain metal layer is patterned to form a source, and the source is connected to the source part through the first through-hole.

Specifically, as shown in FIG. 10, a source-drain metal layer 20 is prepared on the interlayer insulation layer 17, the source-drain metal layer 20 is patterned to form a source 201, and the source 201 is connected to the source part 141 through the first through-hole 31.

In step S600, a planarization layer is prepared on the source-drain metal layer and the photosensitive semiconductor layer, and the planarization layer is patterned to define a third through-hole.

Specifically, as shown in FIG. 11, a planarization layer 21 is prepared on the source-drain metal layer 20 and the photosensitive semiconductor layer 18, and the planarization layer 21 is patterned to define a third through-hole 33.

In step S700, a second transparent electrode layer is prepared on the planarization layer, a first insulation layer is prepared on the second transparent electrode layer, when a fourth through-hole is defined on a part of the first insulation layer corresponding to the third through-hole, the protective layer inside the third through-hole is removed by a same process, and a part of the photosensitive semiconductor layer is exposed by the third through-hole.

Specifically, as shown in FIG. 12 and FIG. 13, a second transparent electrode layer 22 is prepared on the planarization layer 21, a first insulation layer 23 is prepared on the second transparent electrode layer 22, when a fourth through-hole 34 is defined on a part of the first insulation layer 23 corresponding to the third through-hole 33, the protective layer 19 inside the third through-hole 33 is removed by a same process, and a part of the photosensitive semiconductor layer 18 is exposed by the third through-hole 33.

Specifically, when the fourth through-hole 34 is defined on the part of the first insulation layer 23 which is corresponding to the third through-hole 33, the protective layer 19 inside the third through-hole 33 is removed by the same process, and the part of the photosensitive semiconductor layer 18 is exposed by the third through-hole 33, which can simplify the manufacturing process steps of the display panel and reduce the number of the photomasks.

In step S800, the part of the photosensitive semiconductor layer exposed by the third through-hole is oxidated through a plasma treatment to form an insulated connection insulation layer.

Specifically, as shown in FIG. 14, the part of the photosensitive semiconductor layer 18 exposed by the third through-hole 33 is oxidated through a plasma treatment to form an insulated connection insulation layer 41, which can make the connection insulation layer 41 not need to be redeposit a film layer thereon, or does not need a photomask. In this way, the manufacturing process steps of the display panel are greatly simplified and the number of photomasks is reduced.

In step S900, a first transparent electrode layer is prepared on the first insulation layer, the first transparent electrode layer is patterned to form a second electrode, and the second electrode is connected to the connection insulation layer through the third through-hole, and is connected to the photosensitive semiconductor layer through the connection insulation layer.

Specifically, as shown in FIG. 1, a first transparent electrode layer 24 is prepared on the first insulation layer 23, the first transparent electrode layer 24 is patterned to form a second electrode 1022, and the second electrode 1022 is connected to the connection insulation layer 41 through the third through-hole 33, and is connected to the photosensitive semiconductor layer 18 through the connection insulation layer 41.

The above provides a detailed description to the display panel and the manufacture method of the display panel provided in the embodiments of the present disclosure.

Principles and implementation methods of the present disclosure are described by applying specific examples, and the above examples are only used to help understand the methods and core ideas of the present disclosure. Meanwhile, for those skilled in the art, there may be changes in the specific implementation methods and application scope based on the ideas of the present disclosure. In summary, the content of the specification should not be understood as a limitation of the present disclosure.

What is claimed is:

1. A display panel, comprising:
a substrate;
at least one control transistor, disposed on the substrate; wherein each of the at least one control transistor comprises an active layer, and the active layer comprises a source part, a drain part and a channel part disposed between the source part and the drain part;
at least one photosensitive element, wherein the at least one photosensitive element and the at least one control transistor are disposed on a same side of the substrate, each of the at least one photosensitive element comprises a first electrode, a photosensitive semiconductor layer and a second electrode, the first electrode is disposed on the substrate, the photosensitive semiconductor layer is disposed on the first electrode, and the second electrode is disposed on the photosensitive semiconductor layer; and the at least one control transistor is in control connection with the at least one photosensitive element; and
wherein each of the at least one photosensitive element further comprises a connection insulation layer disposed between the second electrode and the photosensitive semiconductor layer.

2. The display panel as claimed in claim 1, wherein the first electrode and the drain part are disposed on a same layer, and the first electrode is electrically connected to the drain part.

3. The display panel as claimed in claim 2, wherein the first electrode has a same material as the drain part.

4. The display panel as claimed in claim 3, wherein a layer structure of the display panel comprises:
the substrate;
the active layer, disposed on the substrate;
a gate insulation layer, disposed on the active layer;
a gate, disposed on the gate insulation layer and covering the channel part;
an interlayer insulation layer, disposed on the gate;
a first through-hole, penetrating the interlayer insulation layer and the gate insulation layer, wherein the first through-hole is disposed corresponding to the source part;
a second through-hole, penetrating the interlayer insulation layer and the gate insulation layer, wherein the second through-hole is disposed corresponding to the first electrode;
a source-drain metal layer, disposed on the interlayer insulation layer, wherein the source-drain metal layer comprises a source, and the source is connected to the source part through the first through-hole;
the photosensitive semiconductor layer, at least partially disposed in the second through-hole;
the connection insulation layer, disposed on the photosensitive semiconductor layer;
a planarization layer, disposed on the source-drain metal layer, the interlayer insulation layer and the photosensitive semiconductor layer, wherein a portion of the planarization layer corresponding to the connection insulation layer is provided with a third through-hole, and the third through-hole exposes at least part of the connection insulation layer;
a first transparent electrode layer, disposed on the planarization layer, wherein the first transparent electrode layer comprises the second electrode, the second electrode is connected to the connection insulation layer through the third through-hole, and is connected to the photosensitive semiconductor layer through the connection insulation layer.

5. The display panel as claimed in claim 4, wherein a side of the photosensitive semiconductor layer which is proximate to the second electrode is provided with a first sub part, and the first sub part is disposed around the connection insulation layer;
a material of the connection insulation layer is obtained by oxidation of a material of the photosensitive semiconductor layer.

6. The display panel as claimed in claim 5, wherein a protective layer is disposed between the first sub part and the planarization layer, and an orthographic projection of the protective layer on the substrate overlaps with an orthographic projection of the first sub part on the substrate.

7. The display panel as claimed in claim 4, wherein an opening of a side of the third through-hole which is proximate to the photosensitive semiconductor layer coincides with an orthographic projection of the connection insulation layer on the substrate.

8. The display panel as claimed in claim 4, wherein the layer structure of the display panel further comprises:
a first insulation layer, disposed between the planarization layer and the first transparent electrode layer, wherein the first insulation layer defines a fourth through-hole, and the second electrode is connected to the connection insulation layer through the fourth through-hole and the third through-hole; and
a second transparent electrode layer, disposed between the first insulation layer and the planarization layer.

9. The display panel as claimed in claim 4, wherein the layer structure of the display panel further comprises:
a buffer layer, disposed between the substrate and the active layer; and
a light-shielding layer, disposed between the buffer layer and the substrate, wherein an orthographic projection of the light-shielding layer on the substrate covers an orthographic projection of the active layer on the substrate and an orthographic projection of the photosensitive semiconductor layer on the substrate.

10. The display panel as claimed in claim 1, wherein a thickness of the connection insulation layer is smaller than or equal to 500 angstroms (Å).

11. The display panel as claimed in claim 1, wherein the display panel comprises a display area and a plurality of frame areas surrounding the display area, wherein the at least one photosensitive element comprises a plurality of photosensitive elements, the plurality of photosensitive elements are distributed in array in at least one of the plurality of frame areas, and adjacent ones of the photosensitive elements are arranged at an interval.

12. The display panel as claimed in claim 1, wherein the display panel further comprises a light blocking layer, and the light blocking layer comprises a plurality of light blocking members, and the plurality of photosensitive elements and the plurality of light blocking members are arranged alternately in a plane of the display panel.

13. A manufacture method of a display panel, comprising:
providing a substrate;

preparing an active layer on the substrate, preparing a gate insulation layer on the active layer, preparing a gate on the gate insulation layer, and preparing an interlayer insulation layer on the gate, wherein the active layer comprises a source part, a drain part, and a channel part disposed between the source part and the drain part;

defining a first through-hole and a second through-hole on the interlayer insulation layer and the gate insulation layer through a same photomask, wherein the first through-hole corresponds to the source part, and the second through-hole corresponds to the drain part;

preparing a photosensitive semiconductor layer at least in the second through-hole, preparing a protective layer on the photosensitive semiconductor layer, and patterning the photosensitive semiconductor layer and the protective layer through a same photomask, wherein the photosensitive semiconductor layer is disposed on the drain part and is connected to the drain part;

preparing a source-drain metal layer on the interlayer insulation layer, and patterning the source-drain metal layer to form a source connected to the source part through the first through-hole;

preparing a planarization layer on the source-drain metal layer and the photosensitive semiconductor layer, and patterning the planarization layer to define a third through-hole;

preparing a second transparent electrode layer on the planarization layer, preparing a first insulation layer on the second transparent electrode layer, when a fourth through-hole is defined on a part of the first insulation layer corresponding to the third through-hole, removing the protective layer inside the third through-hole by a same process, and exposing a part of the photosensitive semiconductor layer by the third through-hole;

oxidizing, through a plasma treatment, the part of the photosensitive semiconductor layer exposed by the third through-hole to form an insulated connection insulation layer; and preparing a first transparent electrode layer on the first insulation layer, and patterning the first transparent electrode layer to form a second electrode, wherein the second electrode is connected to the connection insulation layer through the third through-hole, and is connected to the photosensitive semiconductor layer through the connection insulation layer.

\* \* \* \* \*